US010622260B2

(12) United States Patent
Xie et al.

(10) Patent No.: US 10,622,260 B2
(45) Date of Patent: Apr. 14, 2020

(54) VERTICAL TRANSISTOR WITH REDUCED PARASITIC CAPACITANCE

(71) Applicant: International Business Machines Corporation, Armonk, NY (US)

(72) Inventors: Ruilong Xie, Schenectady, NY (US); Chanro Park, Albany, NY (US); Kangguo Cheng, Schenectady, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/006,238

(22) Filed: Jun. 12, 2018

(65) Prior Publication Data
US 2019/0378765 A1    Dec. 12, 2019

(51) Int. Cl.
*H01L 21/8238*    (2006.01)
*H01L 29/78*    (2006.01)
*H01L 23/535*    (2006.01)
*H01L 27/092*    (2006.01)
*H01L 29/49*    (2006.01)
*H01L 21/764*    (2006.01)

(52) U.S. Cl.
CPC .... *H01L 21/823864* (2013.01); *H01L 21/764* (2013.01); *H01L 21/823871* (2013.01); *H01L 21/823885* (2013.01); *H01L 23/535* (2013.01); *H01L 27/092* (2013.01); *H01L 29/4991* (2013.01); *H01L 29/7827* (2013.01)

(58) Field of Classification Search
CPC ........... H01L 21/823864; H01L 21/764; H01L 29/4991; H01L 27/092; H01L 29/7827; H01L 21/823885; H01L 21/823871; H01L 23/535
USPC ........................................................ 257/329
See application file for complete search history.

(56) References Cited

U.S. PATENT DOCUMENTS

| 6,791,155 | B1* | 9/2004 | Lo ..................... H01L 21/76224 257/506 |
| 9,299,835 | B1 | 3/2016 | Anderson et al. |
| 9,437,503 | B1 | 9/2016 | Mallela et al. |
| 9,443,982 | B1 | 9/2016 | Balakrishnan et al. |
| 9,570,357 | B2 | 2/2017 | Anderson et al. |
| 9,691,850 | B2 | 6/2017 | Cheng et al. |
| 9,716,170 | B1 | 7/2017 | Cheng et al. |
| 9,735,246 | B1 | 8/2017 | Basker et al. |
| 9,748,380 | B1 | 8/2017 | Lie et al. |
| 9,853,028 | B1 | 12/2017 | Cheng et al. |

(Continued)

*Primary Examiner* — Mohammad M Hoque
(74) *Attorney, Agent, or Firm* — Garg Law Firm, PLLC; Rakesh Garg; Joseph Petrokaitis

(57) ABSTRACT

A semiconductor structure includes a first fin and a second fin vertically disposed on a substrate. The first fin is adjacent to and parallel to the second fin. A first source/drain is disposed on the substrate, and a first dielectric spacer is disposed on the first source/drain. A gate is disposed on the first dielectric spacer and a portion of a vertical side of each of the first fin and the second fin. A trench is adjacent to and parallel to the first fin and the second fin. The trench extends through a portion of the substrate and includes a top portion being narrower than a bottom portion. A dielectric material is disposed within the trench and pinches off the top portion of the trench to form an air gap spacer within the trench. The air gap spacer is parallel to and between the first fin and the second fin.

9 Claims, 17 Drawing Sheets

(56) References Cited

U.S. PATENT DOCUMENTS

| | | |
|---|---|---|
| 9,859,166 B1 | 1/2018 | Cheng et al. |
| 10,068,987 B1 * | 9/2018 | Zang ............... H01L 21/823487 |
| 10,263,122 B1 * | 4/2019 | Zang ................. H01L 21/8238 |
| 10,276,689 B2 * | 4/2019 | Qi ..................... H01L 29/66742 |
| 2017/0040222 A1 * | 2/2017 | Anderson ........... H01L 29/7827 |
| 2017/0213899 A1 * | 7/2017 | Cheng ............... H01L 21/28079 |
| 2017/0317212 A1 * | 11/2017 | Kim ..................... H01L 21/764 |

\* cited by examiner

VERTICAL TRANSISTOR WITH REDUCED PARASITIC CAPACITANCE

TECHNICAL FIELD

The present invention relates generally to a method for fabricating a transistor and a structure formed by the method. More particularly, the present invention relates to a method for fabricating a vertical transistor with reduced parasitic capacitance and a structure formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Many semiconductor devices are planar, i.e., where the semiconductor structures are fabricated on one plane. A non-planar device is a three-dimensional (3D) device where some of the structures are formed above or below a given plane of fabrication. A vertical transistor is a non-planar device having a thin vertical silicon "fin" inversion channel on top of the substrate allowing the gate to make a point of contact on the left and right sides of the fin. Source/drains (S/D) are formed on the top and bottom of the vertical fin and the current flows in a direction that is nominal to the substrate as opposed to a lateral flow found in planar semiconductor devices. A vertical Field Effect Transistor (VFET) is a FET formed as a vertical transistor. Epitaxy refers to the deposition of a semiconductor material upon a surface of a semiconductor material during fabrication of a semiconductor. Epitaxy is often used in fabrication of source/drain regions of a FET. Epitaxial material, such as films or layers, are often grown upon the semiconductor surface from gaseous or liquid precursors in which the semiconductor surface acts as a seed for growth of the epitaxial material.

A fin-Field Effect Transistor (finFET) is a non-planar device in which a source and a drain are connected using a fin-shaped conducting channel (fin). Generally, a finFET is fabricated as a multi-gate device in which two or more gates are coupled using one or more fin structures.

SUMMARY

The illustrative embodiments provide a method and apparatus. An embodiment of a method for fabricating a transistor includes receiving a semiconductor structure, the semiconductor structure including a substrate. In the embodiment, the semiconductor structure further includes a first fin and a second fin vertically disposed on the substrate. The embodiment includes forming a first source/drain on the substrate, and forming a first dielectric spacer on the first source/drain. The embodiment further includes forming a gate layer on the first dielectric spacer and a portion of a vertical side of each of the first fin and the second fin. The embodiment further includes depositing a first sacrificial layer between the first fin and the second fin in contact with the gate layer, and recessing the first sacrificial layer below an upper portion of the gate layer. The embodiment further includes forming a trench adjacent to and parallel to the first fin and the second fin, depositing a second sacrificial layer in the trench and in contact with a portion of the gate layer, and forming a second spacer on a portion of the second sacrificial layer in contact with a portion of the gate layer. The embodiment further includes removing the second sacrificial layer, and depositing a dielectric fill in a portion of the trench and pinching-off of the dielectric fill at a top portion of the trench to form an air gap spacer within the trench. In the embodiment, the air gap spacer is adjacent to and parallel to the first fin and the second fin.

In an embodiment, the air gap spacer is formed between the first fin and the second fin. An embodiment further includes removing the first sacrificial layer prior to depositing the dielectric fill. An embodiment further includes removing a top portion of the gate layer, and forming a second dielectric spacer on the gate layer, the gate layer being disposed between the first dielectric spacer and the second dielectric spacer.

An embodiment further includes forming a second source/drain on the second dielectric spacer. An embodiment further includes depositing an interlayer dielectric on the semiconductor structure. An embodiment further includes forming a first contact through the interlayer dielectric in contact with the second source/drain. An embodiment further includes forming a second contact through the interlayer dielectric in contact with the gate. An embodiment further includes forming a third contact through the interlayer dielectric in contact with the first source/drain.

In an embodiment, the air gap is confined between and parallel to the first fin and second fin. In another embodiment, the air gap is not disposed at an end of the first fin and the second fin. In an embodiment, the second spacer is formed of an oxide material. In an embodiment, the first sacrificial layer is an organic planarization layer (OPL).

An embodiment of an apparatus includes a substrate, and a first fin and a second fin vertically disposed on the substrate, the first fin being adjacent to and parallel to the second fin. The embodiment further includes a first source/drain disposed on the substrate, and a first dielectric spacer disposed on the first source/drain. The embodiment further includes a gate disposed on the first dielectric spacer and a portion of a vertical side of each of the first fin and the second fin. The embodiment further includes a trench adjacent to and parallel to the first fin and the second fin, the trench extending through a portion of the substrate, the trench including a top portion being narrower than a bottom portion. The embodiment further includes a dielectric material disposed within the trench and pinching off the top portion of the trench to form an air gap spacer within the trench, the air gap spacer being parallel to and between the first fin and the second fin.

An embodiment further includes a second dielectric spacer on the gate, the gate being disposed between the first dielectric spacer and the second dielectric spacer. An embodiment further includes a second source/drain disposed on the second dielectric spacer. The embodiment further includes a first contact in contact with the second source/drain, the first contact partially overlapping the air gap.

An embodiment includes a computer usable program product. The computer usable program product includes one or more computer-readable storage devices, and program instructions stored on at least one of the one or more storage devices.

In an embodiment, the computer usable code is stored in a computer readable storage device in a data processing system, and wherein the computer usable code is transferred over a network from a remote data processing system.

In an embodiment, the computer usable code is stored in a computer readable storage device in a server data processing system, and wherein the computer usable code is downloaded over a network to a remote data processing system for use in a computer readable storage device associated with the remote data processing system.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
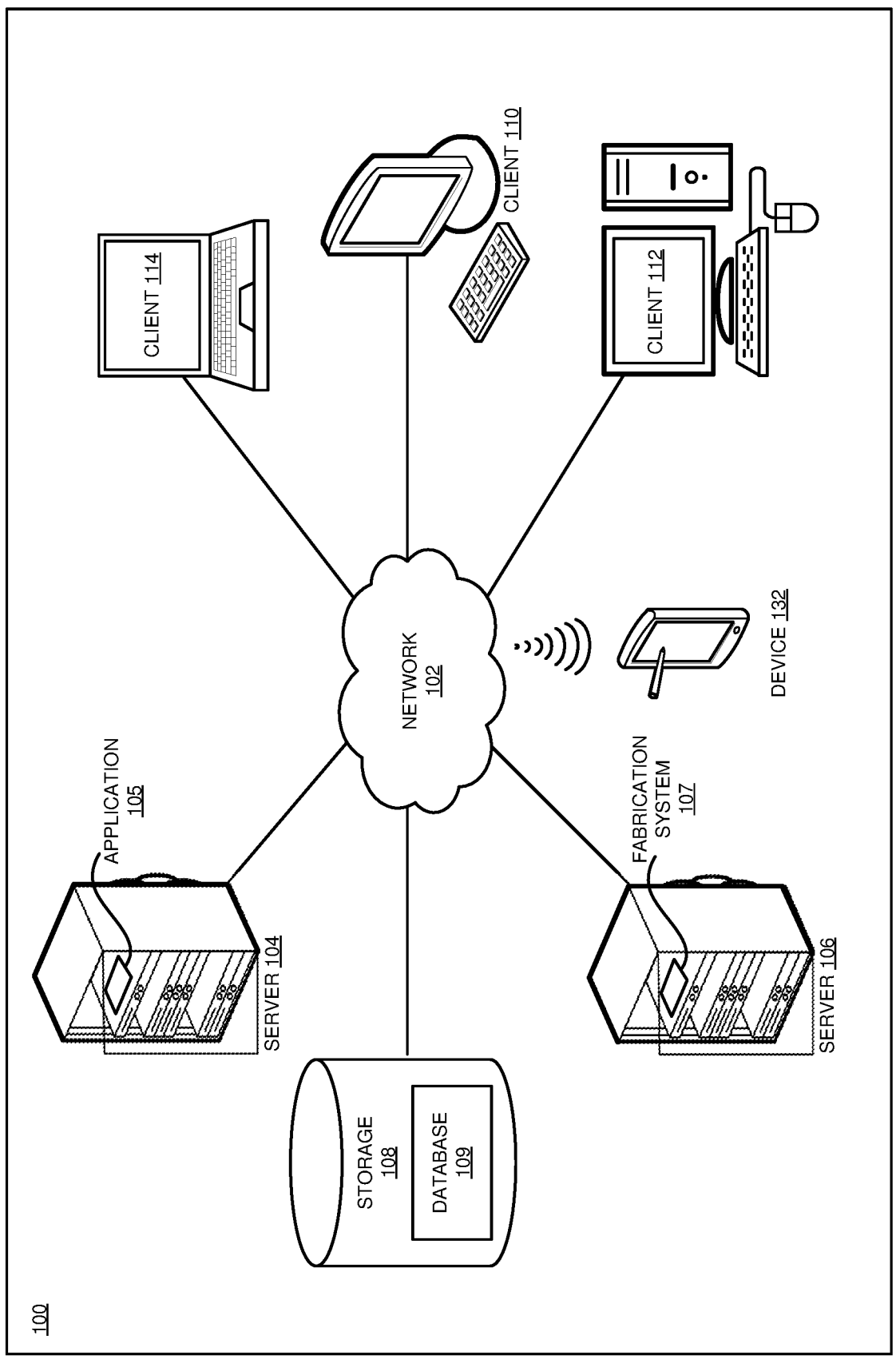
FIG. 1 depicts a block diagram of a network of data processing systems in which illustrative embodiments may be implemented.

The illustrative embodiments relate to a method for fabricating vertical transistors with reduced parasitic capacitance and a structure formed by the method. The illustrative embodiments recognize that the present methods and techniques for fabricating vertical transistors suffer from several problems. For a VFET with extremely small gate pitch, there is increasing parasitic capacitance between adjacent gates, between adjacent gate and source/drain, and between adjacent bottom source/drains. As a result, device performance is decreased. An air gap spacer is very useful to reduce parasitic capacitance for highly scaled metal-oxide-semiconductor (MOS) transistors. One process that may be used to fabricate an air gap spacer is to introduce the air-gap into an interlayer dielectric (ILD) during forming of the ILD. However, the capacitance between the bottom source/drain is still high. In addition, by forming an air gap spacer in the ILD, air gaps may be created in a number of locations which can easily generate a subway issue in which the source/drain contact and/or the gate contact overlays an air gap leading to possible intrusion of metals into the air gap during fabrication.

Various embodiments described herein provide for a method and structure for forming vertical transistors, such as a MOSFET transistor, with air gap spacers that are not subject to the above described problems encountered during conventional fabrication of transistors having air spacers.

One or more embodiments described herein provide for fabrication of a vertical transistor with reduced parasitic capacitance. An embodiment includes forming VFET fins, a bottom spacer, a high-k metal gate (HKMG), and a top spacer upon a substrate of a semiconductor structure. The embodiment further includes depositing a first soft sacrificial material, such as an organic planarization layer (OPL), on the semiconductor structure, and recessing the first sacrificial material below the top spacer. The embodiment further includes forming a second spacer over the sacrificial layer, cutting the second spacer and sacrificial material from the fin edge, and filling the resultant space with dielectric material. The embodiment further includes removing the sacrificial material and forming an air gap spacer between adjacent parallel fins but not in fin-to-fin tip regions. In one or more embodiments, contacts can be reliably formed without metal intrusion into the air gap.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate transistors having robust air spacers.

For the clarity of the description, and without implying any limitation thereto, the illustrative embodiments are described using a particular VFET structure having a particular number of fins and gates. An embodiment can be implemented with a different number of gates, different number of fins, or both, within the scope of the illustrative embodiments.

Furthermore, a simplified diagram of the example vertical transistors is used in the figures and the illustrative embodiments. In an actual fabrication of a vertical transistor, additional structures that are not shown or described herein may be present without departing the scope of the illustrative embodiments. Similarly, within the scope of the illustrative embodiments, a shown or described structure in the example vertical transistors may be fabricated differently to yield a similar operation or result as described herein.

Differently shaded portions in the two-dimensional drawing of the example transistors are intended to represent different structures in the example transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating transistors according to the illustrative embodiments.

Furthermore, the illustrative embodiments are described with respect to transistors only as an example. The steps described by the various illustrative embodiments can be adapted for fabricating other planar and non-planar devices in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating transistor devices. An embodiment provides a method for fabricating transistors.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
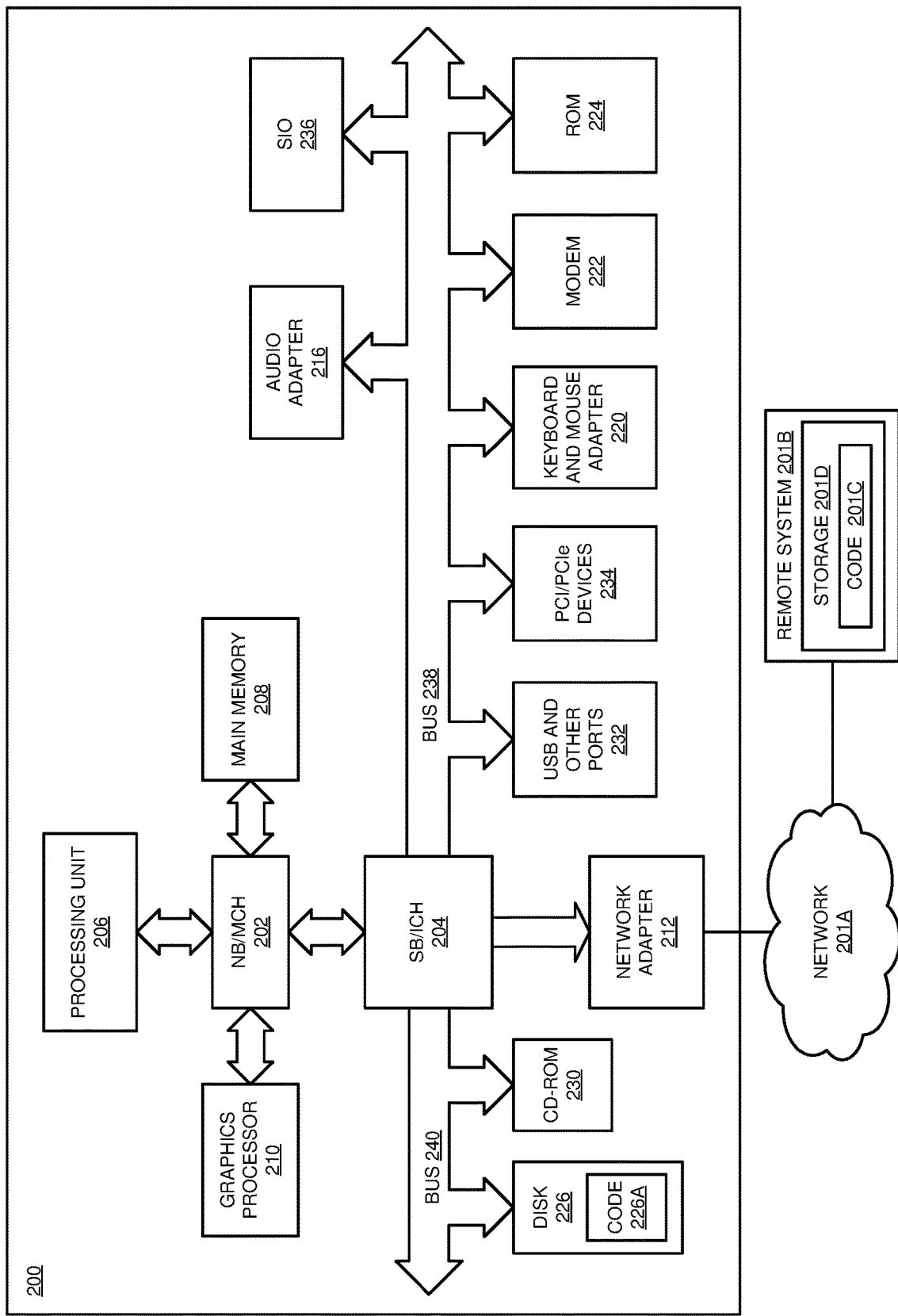
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be Implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-15, these figures depict portions of an example process for fabricating a vertical transistor with reduced parasitic capacitance in accordance with one or more illustrative embodiments. In the particular embodiments illustrated in FIGS. 3-15, a single vertical transistor is fabricated upon a substrate and/or wafer. It should be understood that in other embodiments, any combination of transistors or other combinations of any numbers of semiconductor devices, may be fabricated on a substrate in a similar manner.

Figure 3:
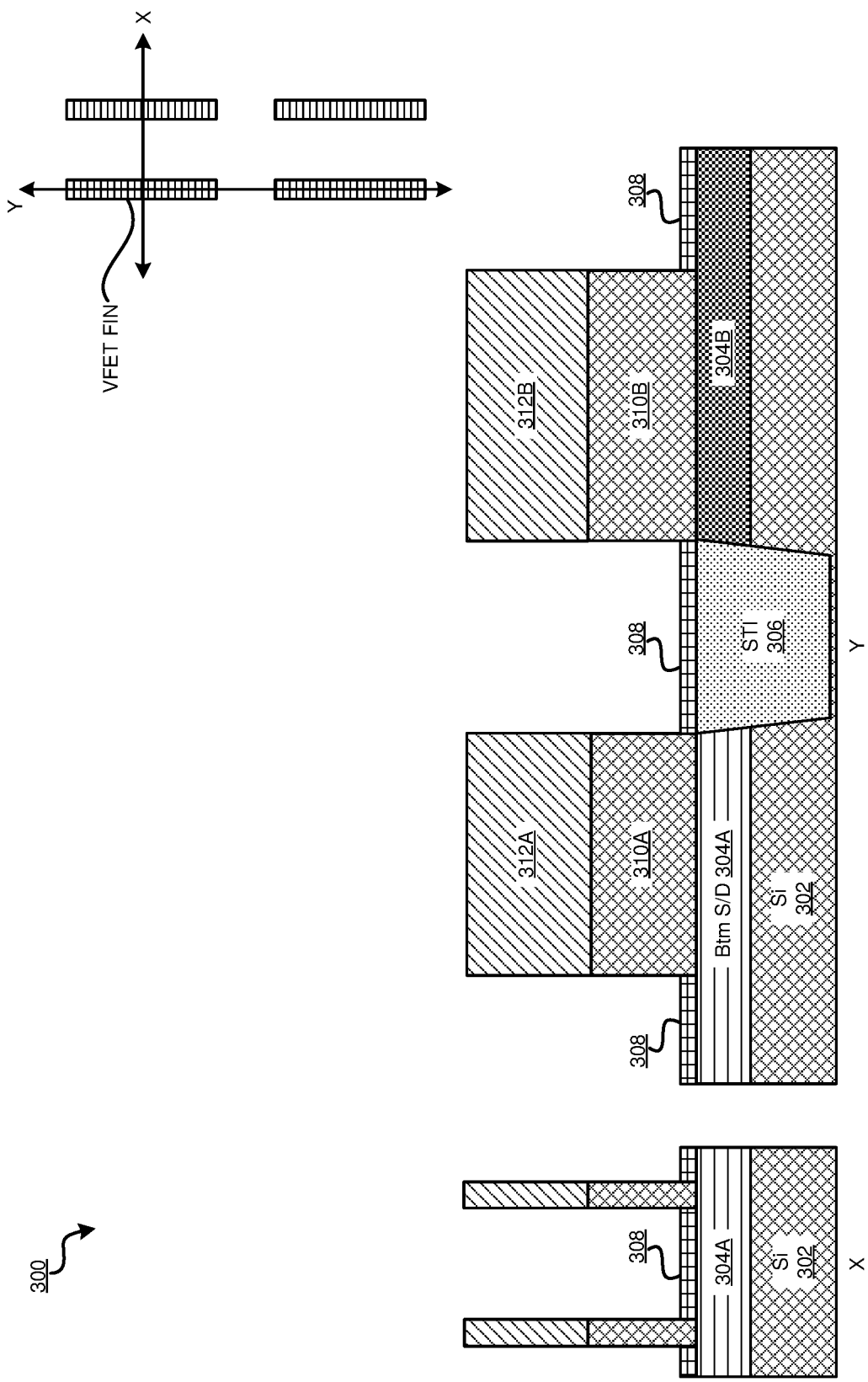
FIG. 3 depicts cross-section views of a portion of a process for fabricating a vertical transistor in which a structure is formed according to an illustrative embodiment.

With reference to FIG. 3, this figure depicts cross-section views of a portion of a process for fabricating a vertical transistor in which a structure 300 is formed according to an illustrative embodiment. FIG. 3 further illustrates a first cross-section view perpendicular to a first direction X, and second cross-section view perpendicular to a second direction Y. In the embodiment, fabrication system 107 receives structure 300. Structure 300 includes a substrate 302 having a first bottom source/drain (S/D) 304A and a second bottom S/D 304B formed on a top surface of substrate 302. The substrate can be any suitable substrate material, such as, for example, monocrystalline Si, SiGe, SiC, III-V compound semiconductor, II-VI compound semiconductor, or semiconductor-on-insulator (SOI). In some embodiments, the substrate includes a buried oxide layer (not depicted). Fins are semiconductors that can have the same material or different materials from the substrate. In a particular embodiment, substrate 302 is formed of a silicon (Si) material. In a particular embodiment first bottom S/D 304A is formed of an n-type doped material, and second bottom S/D 304B is formed of a p-type doped material.

In various embodiments, source and drains are formed by any suitable technique. In an exemplary embodiment, source/drain are formed by an in-situ doped (i.e., during growth) epitaxial material such as in-situ doped epitaxial Si, carbon doped silicon (Si:C) and/or SiGe. Suitable n-type dopants include but are not limited to phosphorous (P), and suitable p-type dopants include but are not limited to boron (B). The use of an in-situ doping process is merely an example. For instance, one or more embodiments may employ an ex-situ process to introduce dopants into the source and drains. Other doping techniques include but are not limited to, ion implantation after the bottom source/drain are formed. Dopant techniques include but are not limited to, ion implantation, gas phase doping, plasma doping, plasma immersion ion implantation, cluster doping, infusion doping, liquid phase doping, solid phase doping, in-situ epitaxy growth, or any suitable combination of these techniques.

Structure 300 further includes a shallow trench isolation (STI) layer 306 disposed within a trench of substrate 302. The STI can be formed, for example, by patterning, dielectric filling, and dielectric recessing. Structure 300 further includes a first dielectric spacer 308 disposed upon portions of upper surfaces of first bottom S/D 304A, second bottom S/D 304B, and STI layer 306. In one or more embodiments, first dielectric spacer 308 may be formed of a dielectric material such as $SiO_2$, SiN, SiC, SiOC, SiCN, BN, SiBN, SiBCN, SiOCN, SiON, and combinations thereof.

Structure 300 further includes a first fin 310A and a second fin 310B vertically disposed on a portion of the upper surface of first bottom S/D 304A, second bottom S/D 304B, respectively. In a particular embodiment, first fin 310A and second fin 310B are each formed of an Si material. Structure 300 further includes a first hardmask 312A and a second hardmask 312B disposed upon an upper surface of first fin 310A and second fin 310B, respectively.

Figure 4:
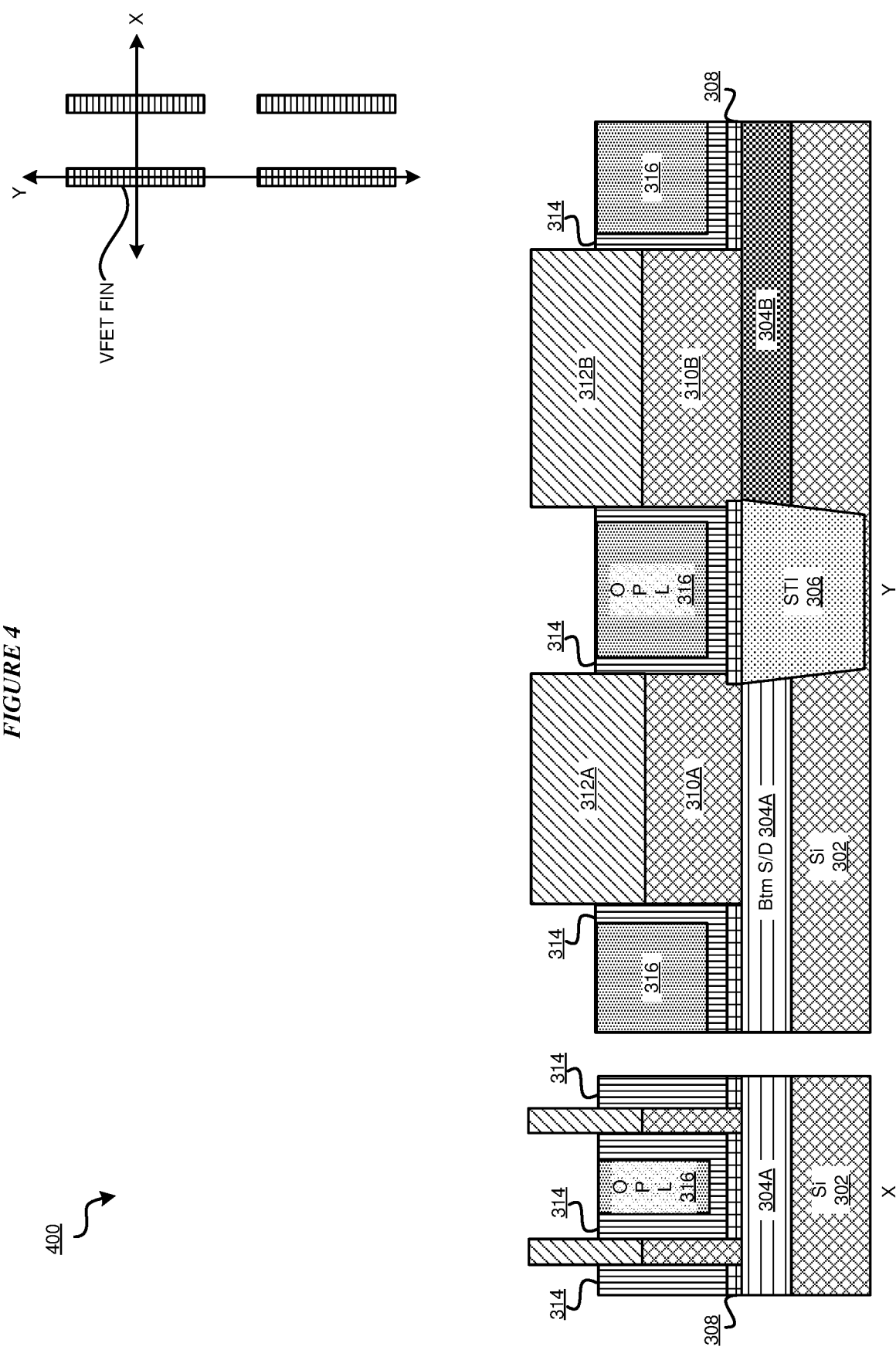
FIG. 4 depicts cross-section views of another portion of the process in which a structure is formed according to an illustrative embodiment.

With reference to FIG. 4, this figure depicts cross-section views of another portion of the process in which a structure 400 is formed according to an illustrative embodiment. In the embodiment, fabrication system 107 forms a high-k metal gate (HKMG) layer 314 upon first dielectric spacer 308 and vertical sides of portions of first fin 310A, first hardmask 312A, second fin 310B, and second hardmask 312B. In a particular embodiment, HKMG layer 314 is formed of a high dielectric constant (high-k) gate dielectric material and a gate conductor.

In one or more embodiments, the gate dielectric material can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived.

In one or more embodiments, the gate conductor can comprise any suitable conducting material including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, carbon nanotube, conductive carbon, graphene, or any suitable combination of these materials. The conductive material may further comprise dopants that are incorporated during or after deposition.

In some embodiments, the gate may further comprise a workfunction setting layer between the gate dielectric and gate conductor. In one or more embodiments, the workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. In various embodiments, the gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

In the embodiment, fabrication system 107 deposits a first sacrificial layer 316 in contact with HKMG layer 314 and recesses first sacrificial layer 316 to an upper level of HKMG layer 314 such that first sacrificial layer 316 fills a void formed by HKMG layer 314. In a particular embodiment, first sacrificial layer 316 is an organic planarization layer (OPL).

Figure 5:
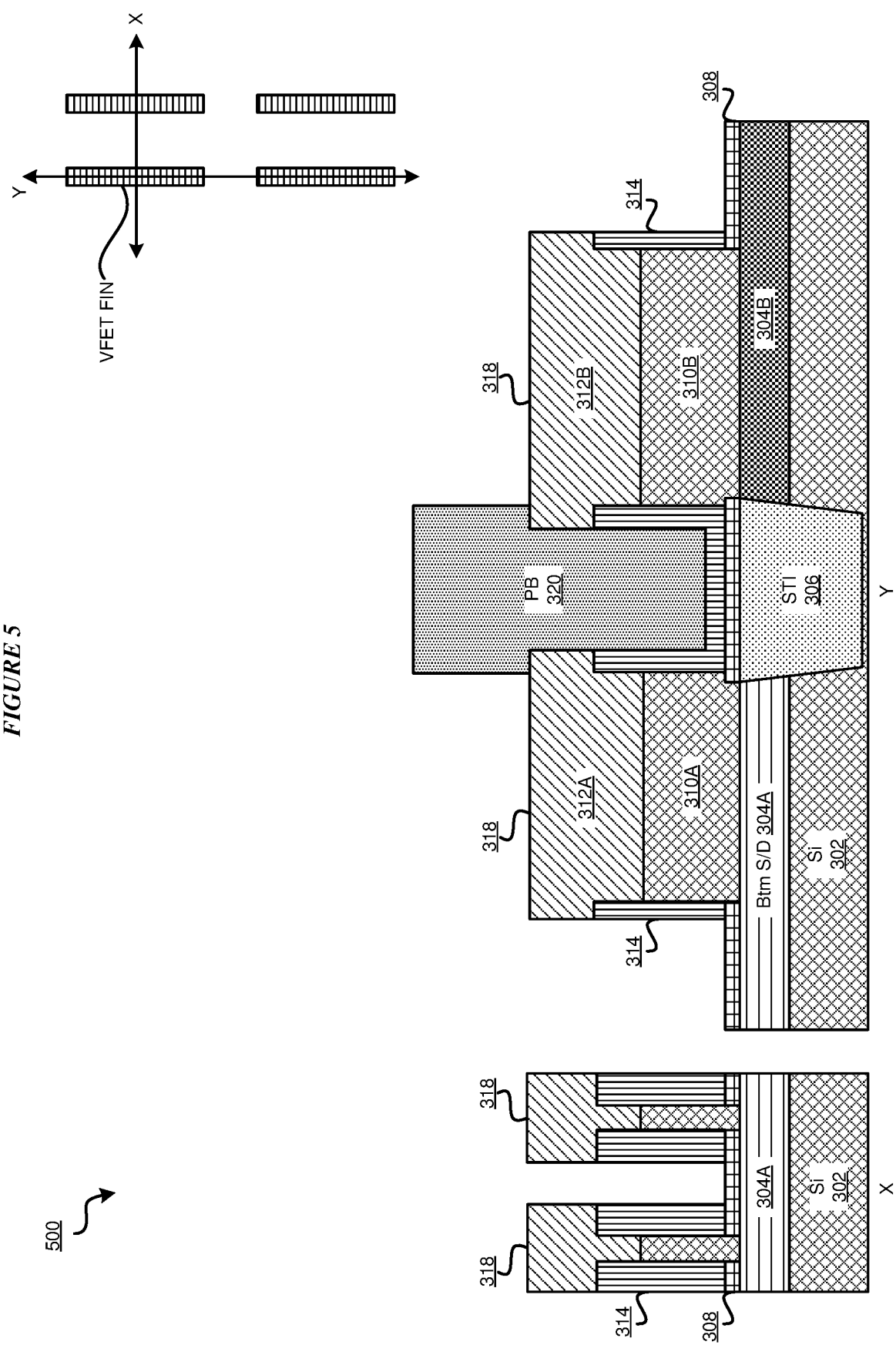
FIG. 5 depicts cross-section views of another portion of the process in which a structure is formed according to an illustrative embodiment.

With reference to FIG. 5, this figure depicts cross-section views of another portion of the process in which a structure 500 is formed according to an illustrative embodiment. In the embodiment, fabrication system 107 forms a second dielectric spacer 318 on portions of first hardmask 312A, second hardmask 312B, and HKMG layer 314. In the embodiment, fabrication system 107 applies a first (PB) mask 320 to portions of first sacrificial layer 316 disposed between first fin 310A and second fin 310B, performs patterning, and etches away the portions of first sacrificial layer 316 not protected by first mask 320 and horizontal portions of HKMG layer 314. In a particular embodiment, fabrication system 107 etches portions of first sacrificial layer 316 and HKMG layer 314 using a reactive-ion etching (RIE) process.

Figure 6:
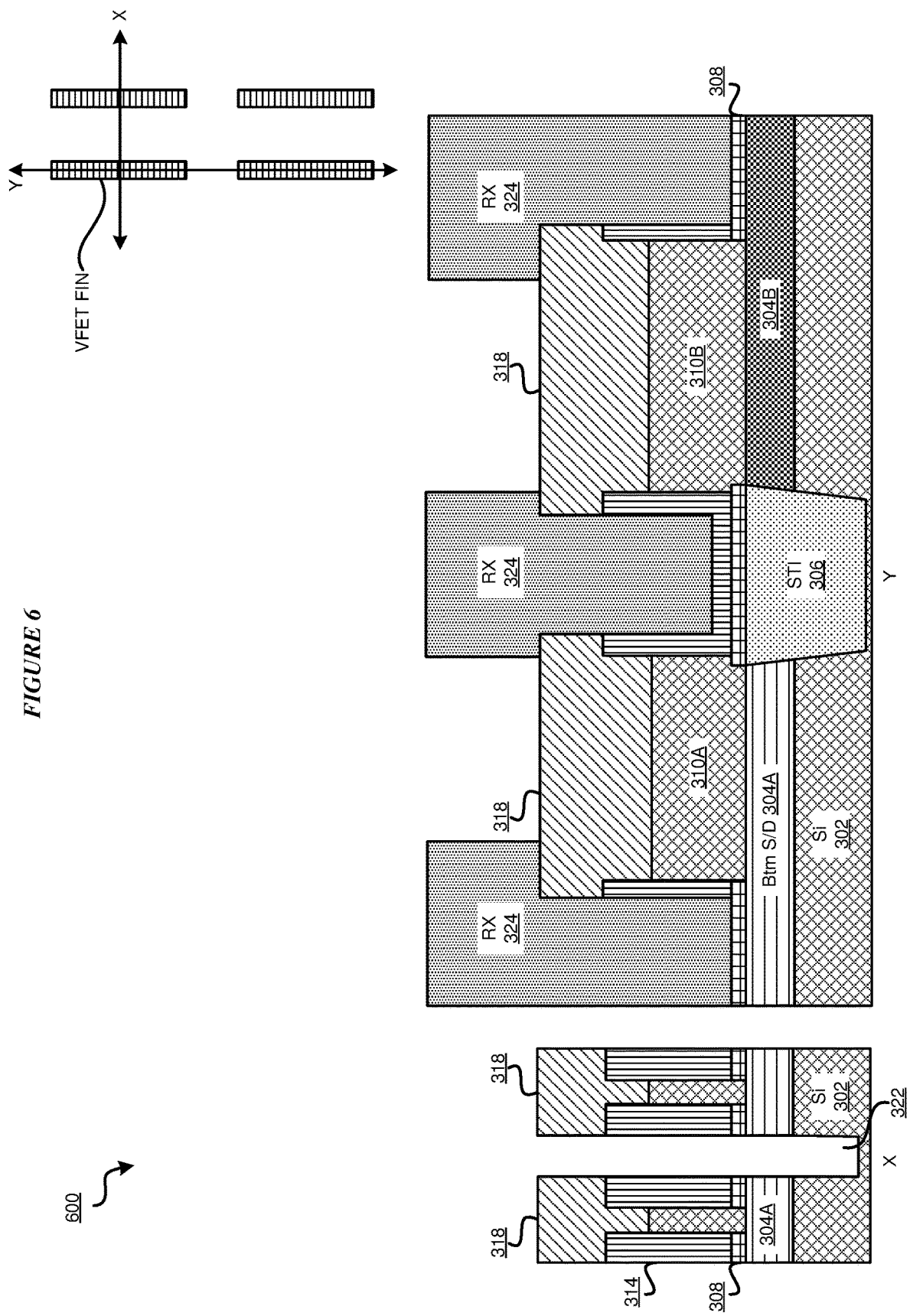
FIG. 6 depicts cross-section views of another portion of the process in which a structure is formed according to an illustrative embodiment.

With reference to FIG. 6, this figure depicts cross-section views of another portion of the process in which a structure 600 is formed according to an illustrative embodiment. In the embodiment, fabrication system 107 strips first mask 320, and applies a second (RX) mask 324 to protect the remaining portions of HKMG layer 314. In the embodiment, fabrication system 107 forms an isolation trench 322 into substrate 302 between first fin 310A and second fin 310B in the Y direction by etching into a portion of substrate 302. Accordingly, isolation trench 322 is formed between adjacent parallel fins 310A and 310B. In a particular embodiment, fabrication system 107 forms isolation trench 322 using an RIE process through the bottom spacer layer, the bottom source/drain layer, and into substrate 302.

Figure 7:
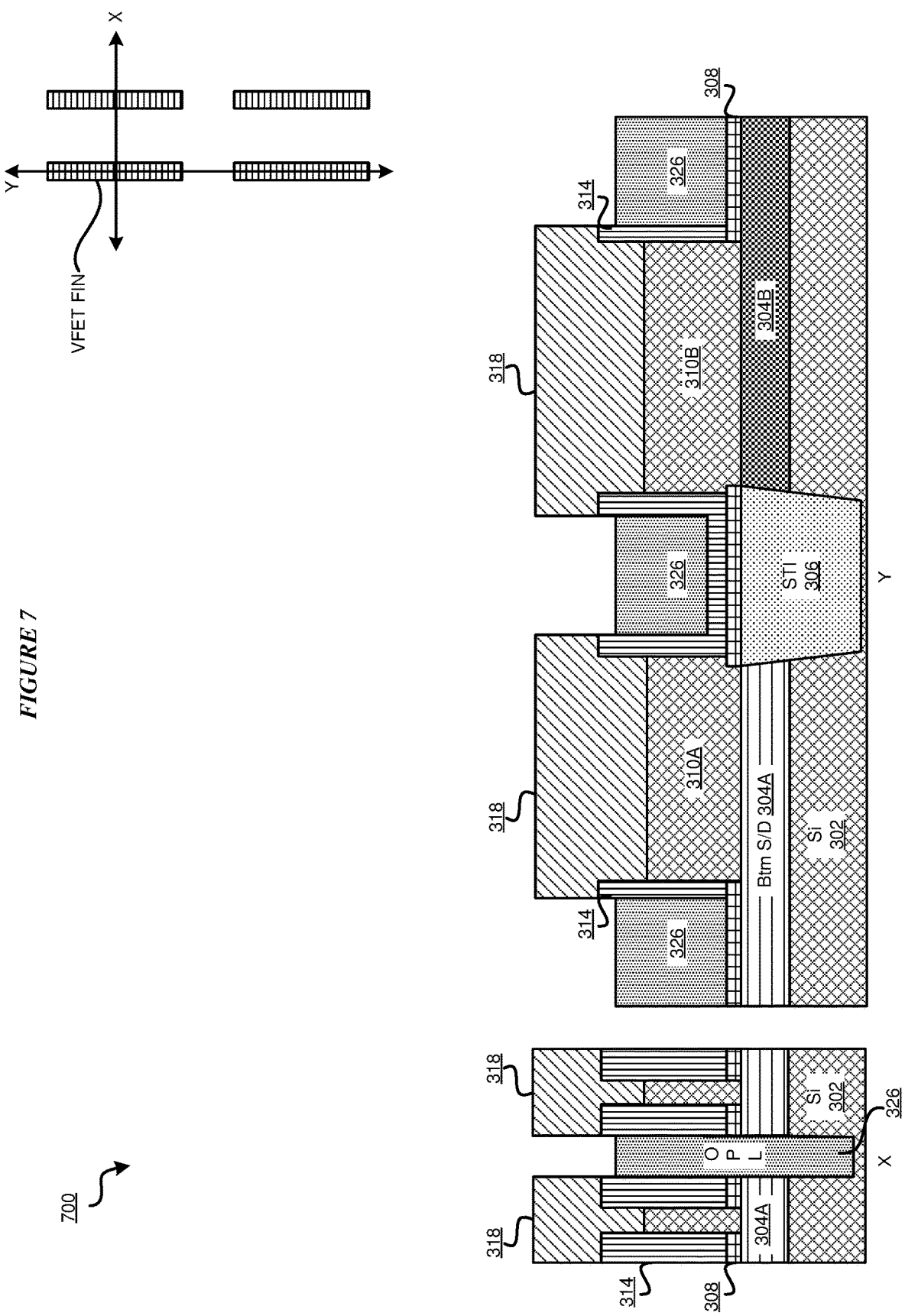
FIG. 7 depicts cross-section views of another portion of the process in which a structure is formed according to an illustrative embodiment.

With reference to FIG. 7, this figure depicts cross-section views of another portion of the process in which a structure 700 is formed according to an illustrative embodiment. In the embodiment, fabrication system 107 strips second mask 324 and deposits a second sacrificial layer 326 upon portions of HKMG layer 314. In a particular embodiment, second sacrificial layer 326 is an organic planarization layer (OPL). In the embodiment, fabrication system 107 recesses second sacrificial layer 326 to below the top level of HKMG layer 314. In the embodiment, second sacrificial layer 326 also fills trench 322.

Figure 8:
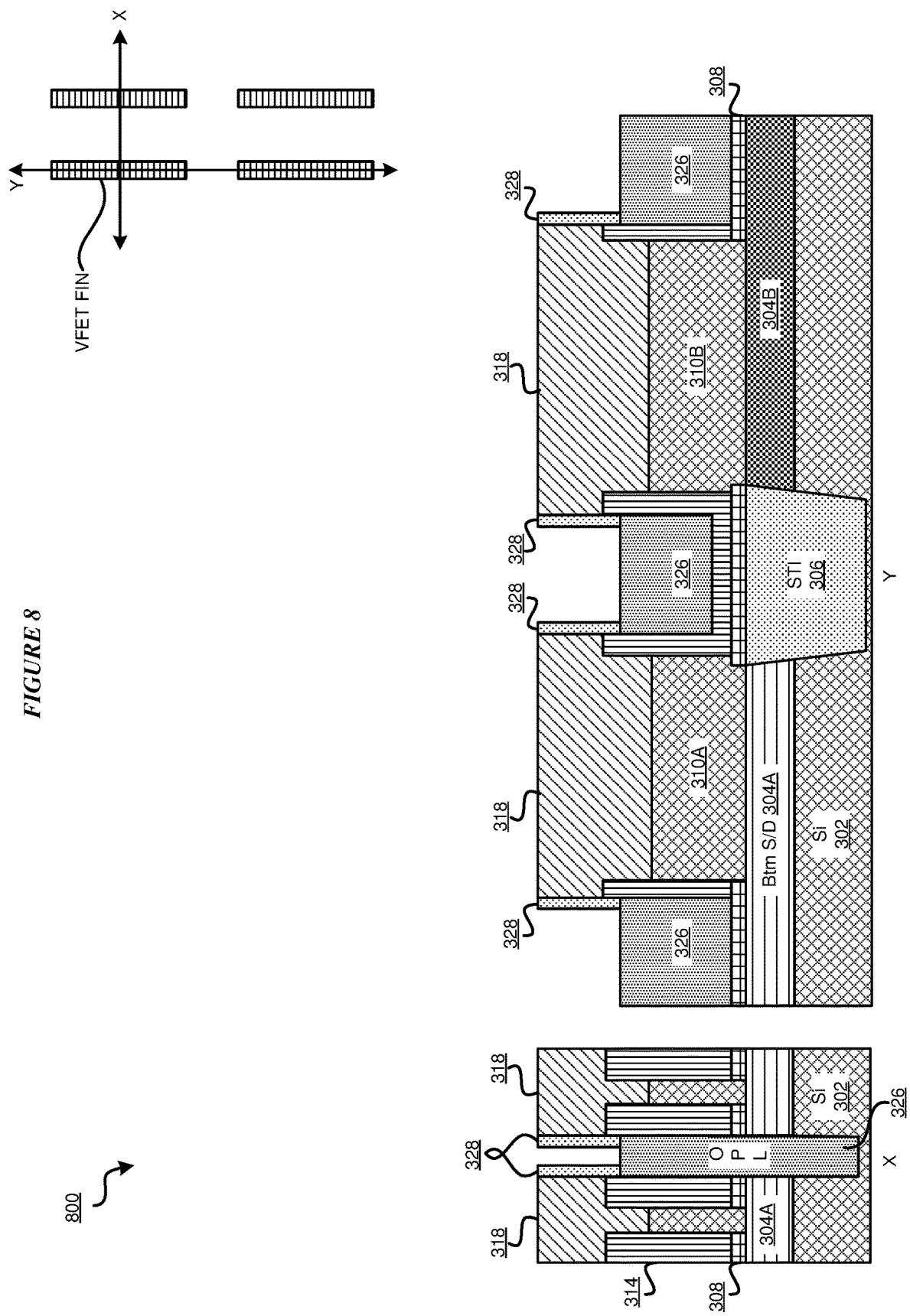
FIG. 8 depicts cross-section views of another portion of the process in which a structure is formed according to an illustrative embodiment.

With reference to FIG. 8, this figure depicts cross-section views of another portion of the process in which a structure 800 is formed according to an illustrative embodiment. In the embodiment, fabrication system 107 forms a spacer (e.g., an oxide spacer) 328 upon a portion of second sacrificial layer 326 and side surfaces of second dielectric spacer 318 within isolation trench 322. In a particular embodiment, spacer 328 is formed of an oxide material. Optionally, after formation of the spacer 328, the second sacrificial layer 326 is stripped. In an alternative embodiment, second sacrificial layer 326 is kept and additional OPL is deposited in next step.

Figure 9:
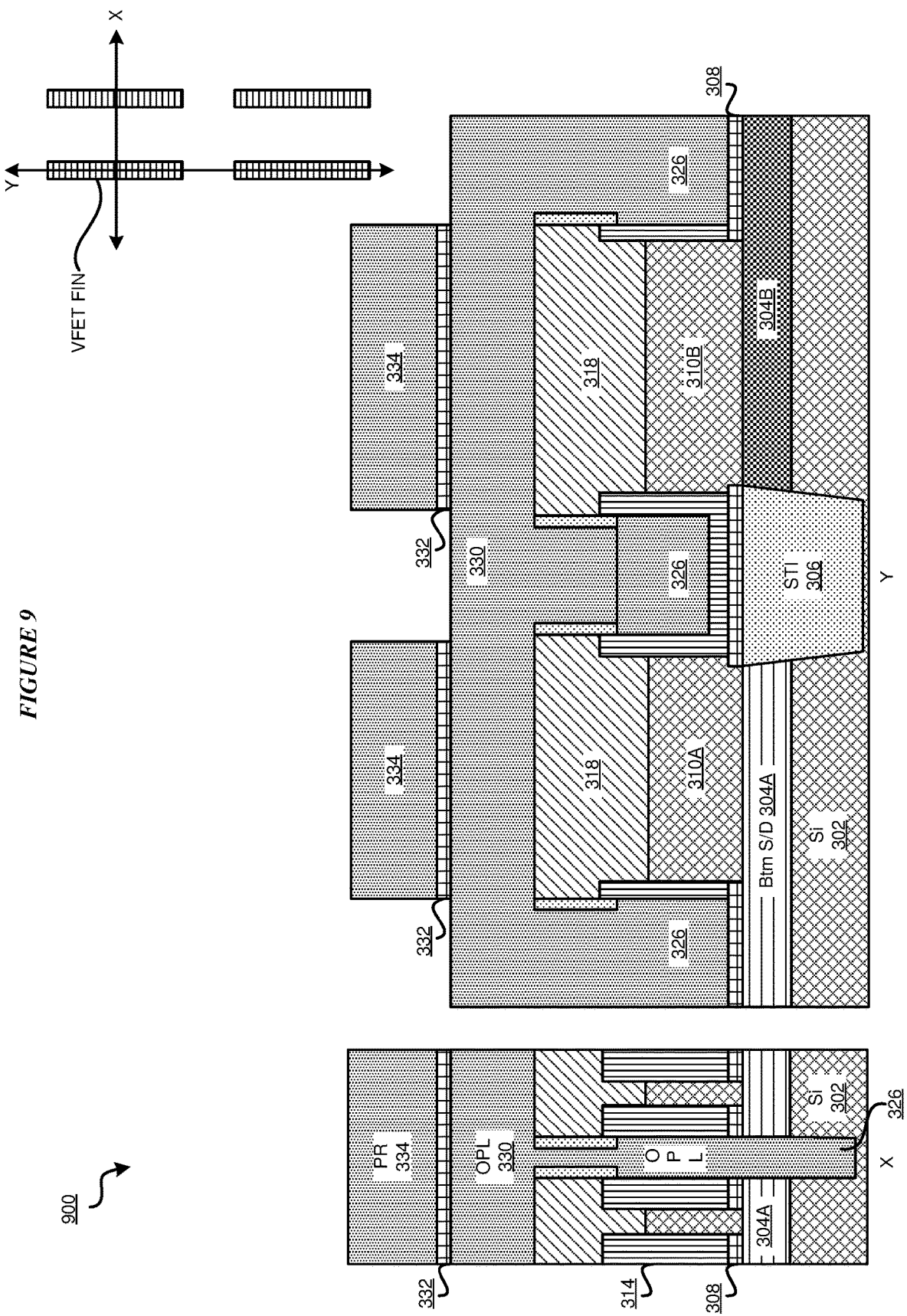
FIG. 9 depicts cross-section views of another portion of the process in which a structure is formed according to an illustrative embodiment.

With reference to FIG. 9, this figure depicts cross-section views of another portion of the process in which a structure 900 is formed according to an illustrative embodiment. In the embodiment, fabrication system 107 deposits a third sacrificial layer 330 upon second dielectric spacer 318. In a particular embodiment, third sacrificial layer 330 is an organic planarization layer (OPL). In the embodiment, fabrication system 107 further deposits a fourth sacrificial layer 332 upon an upper surface of third sacrificial layer 330. In an embodiment, fourth sacrificial layer 332 is a coating layer to control the reflection and light absorption during photolithography and may be formed of an organic or inorganic material. In the embodiment, fabrication system 107 applies a third (PR) mask 334 to fourth sacrificial layer 332.

Figure 10:
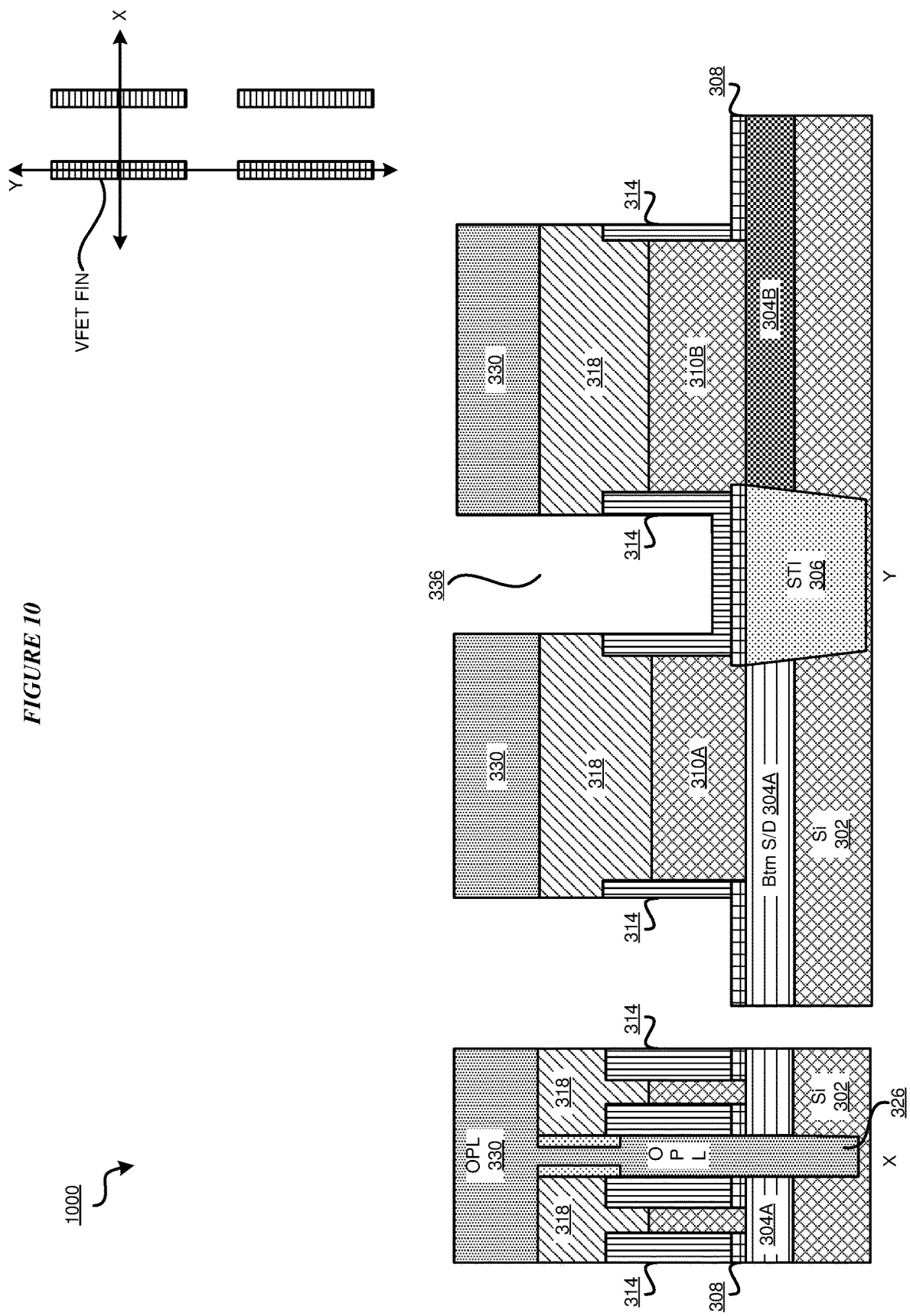
FIG. 10 depicts cross-section views of another portion of the process in which a structure is formed according to an illustrative embodiment.

With reference to FIG. 10, this figure depicts cross-section views of another portion of the process in which a structure 1000 is formed according to an illustrative embodiment. In the embodiment, fabrication system 107 etches portions of third sacrificial layer 330 and second sacrificial layer 326 above STI layer 306 to form a trench 336 to expose HKMG layer 314. In the embodiment, fabrication system 107 removes third mask 334 and fourth sacrificial layer 332. In the embodiment, fabrication system 107 removes oxide spacer 328.

Figure 11:
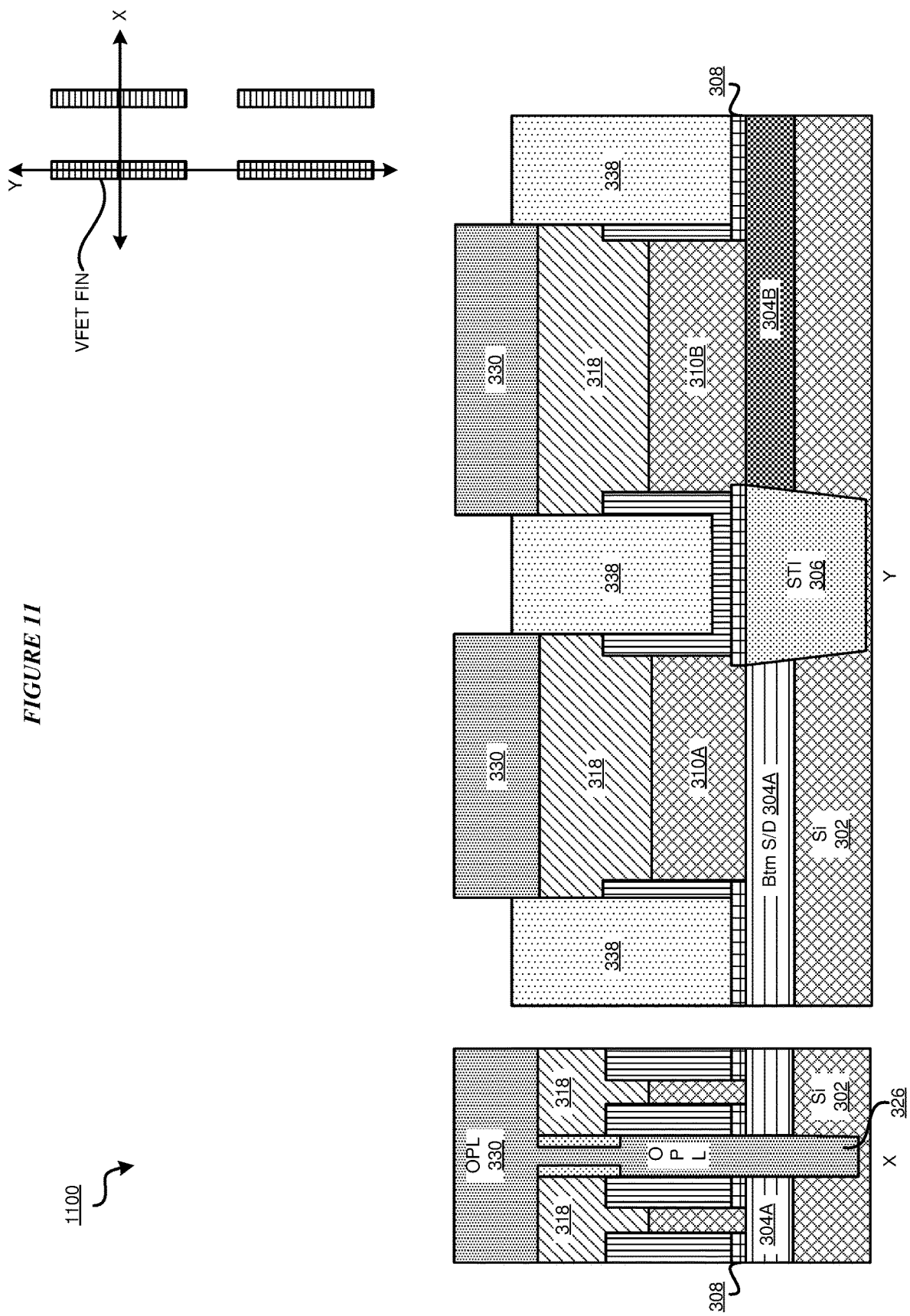
FIG. 11 depicts cross-section views of another portion of the process in which a structure is formed according to an illustrative embodiment.

With reference to FIG. 11, this figure depicts cross-section views of another portion of the process in which a structure 1100 is formed according to an illustrative embodiment. In the embodiment, fabrication system 107 deposits a first dielectric fill 338 upon the top surface of first dielectric spacer 308, HKMG layer 314, and trench 336. In the embodiment, fabrication system 107 etches back first dielectric fill 338 to below a top level of third sacrificial layer 330. In a particular embodiment, the first dielectric fill 338 includes a dielectric liner (e.g., silicon nitride) on trench sidewalls and oxide in the rest of the trench.

Figure 12:
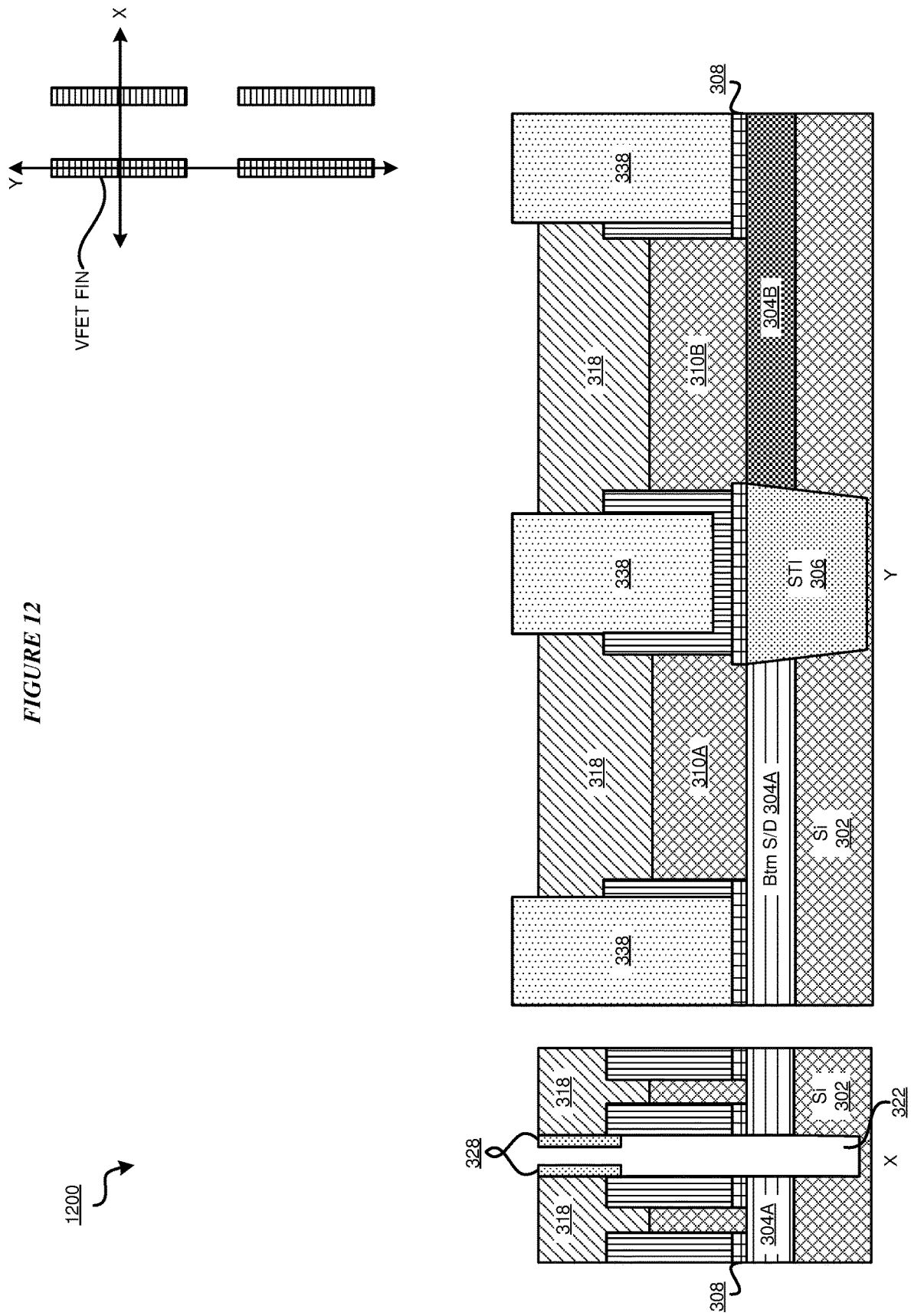
FIG. 12 depicts cross-section views of another portion of the process in which a structure is formed according to an illustrative embodiment.

With reference to FIG. 12, this figure depicts cross-section views of another portion of the process in which a structure 1200 is formed according to an illustrative embodiment. In the embodiment, fabrication system 107 removes third sacrificial layer 330 and second sacrificial layer 326.

Figure 13:
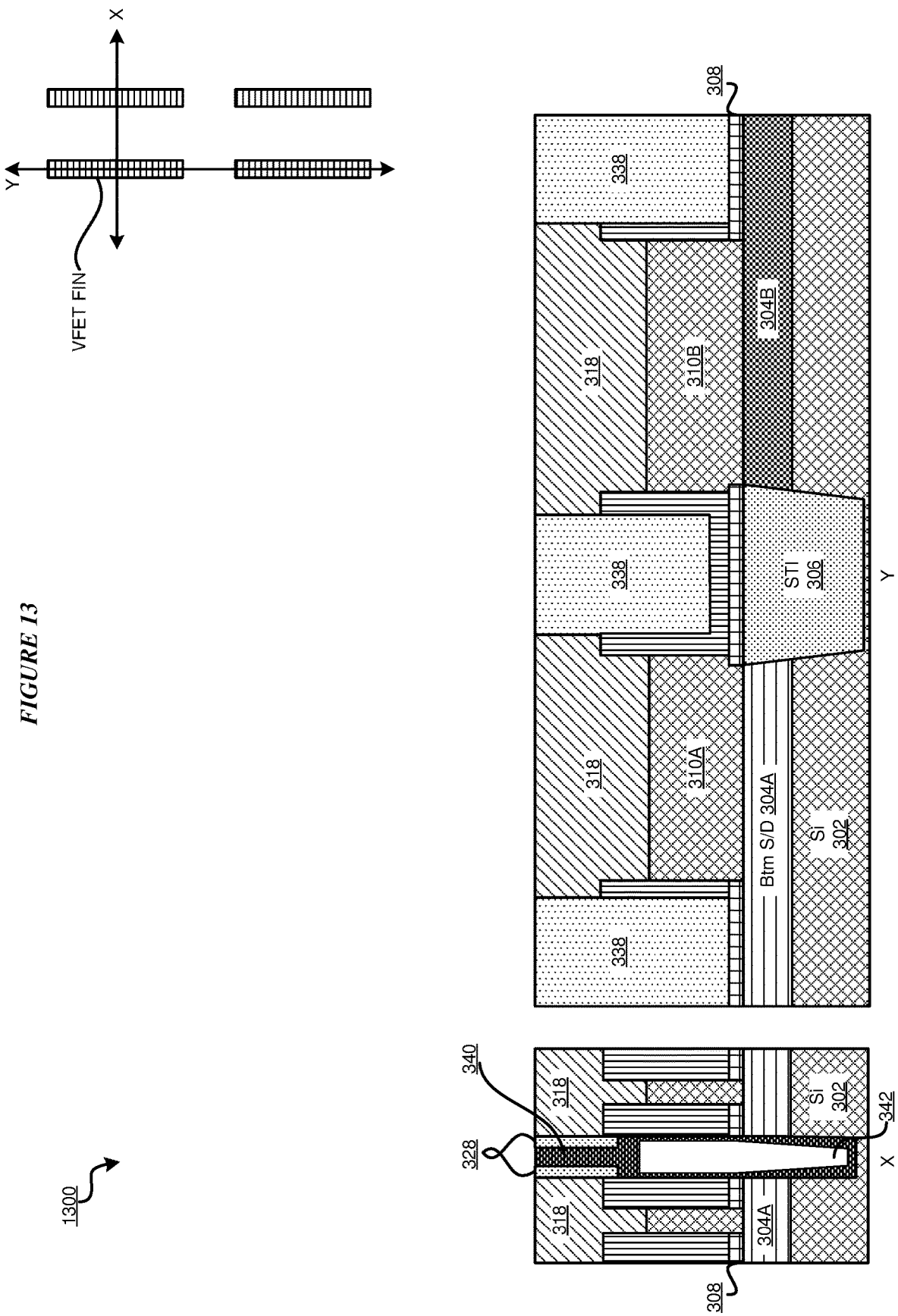
FIG. 13 depicts cross-section views of another portion of the process in which a structure is formed according to an illustrative embodiment.

With reference to FIG. 13, this figure depicts cross-section views of another portion of the process in which a structure 1300 is formed according to an illustrative embodiment. In the embodiment, fabrication system 107 deposits a second dielectric fill 340 in a portion of isolation trench 322 with a pinch-off at the top portion of isolation trench 322 to form an air gap spacer 342 within isolation trench 322 between adjacent parallel fins 310A and 310B but not in fin end regions of fins 310A and 310B of the vertical transistor structure.

In the embodiment, spacer 328 in the upper portion of the trench creates a bottle-shaped trench, i.e., the opening of the trench top is narrower than trench bottom. When second dielectric fill 340 is deposited in isolation trench 322, second dielectric fill 340 covers the trench sidewalls first, and eventually pinches off at the narrow trench top, forming air gap in the lower portion of isolation trench 322.

In one or more embodiments, second dielectric fill 340 used to pinch off isolation trench 322 can be silicon oxide, silicon nitride (SiN), SiC, SiOC, SiCN, BN, SiBN, SiBCN, SiOCN, SiON, carbon doped silicon oxide, fluorine doped silicon oxide, boron carbon nitride, hydrogen silsesquioxane polymer (HSQ), methyl silsesquioxane polymer (MSQ), methyl doped silica or $SiO_x(CH_3)_y$, or $SiC_xO_yH_y$, organosilicate glass (SiCOH), and porous SiCOH, and mixtures thereof. In one or more embodiments, deposition techniques for depositing second dielectric fill 340 include but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), and sub-atmospheric chemical vapor deposition (SACVD).

In the embodiment, fabrication system 107 further performs a chemical mechanical planarization (CMP) process to planarize the top surface of structure 1300.

Figure 14:
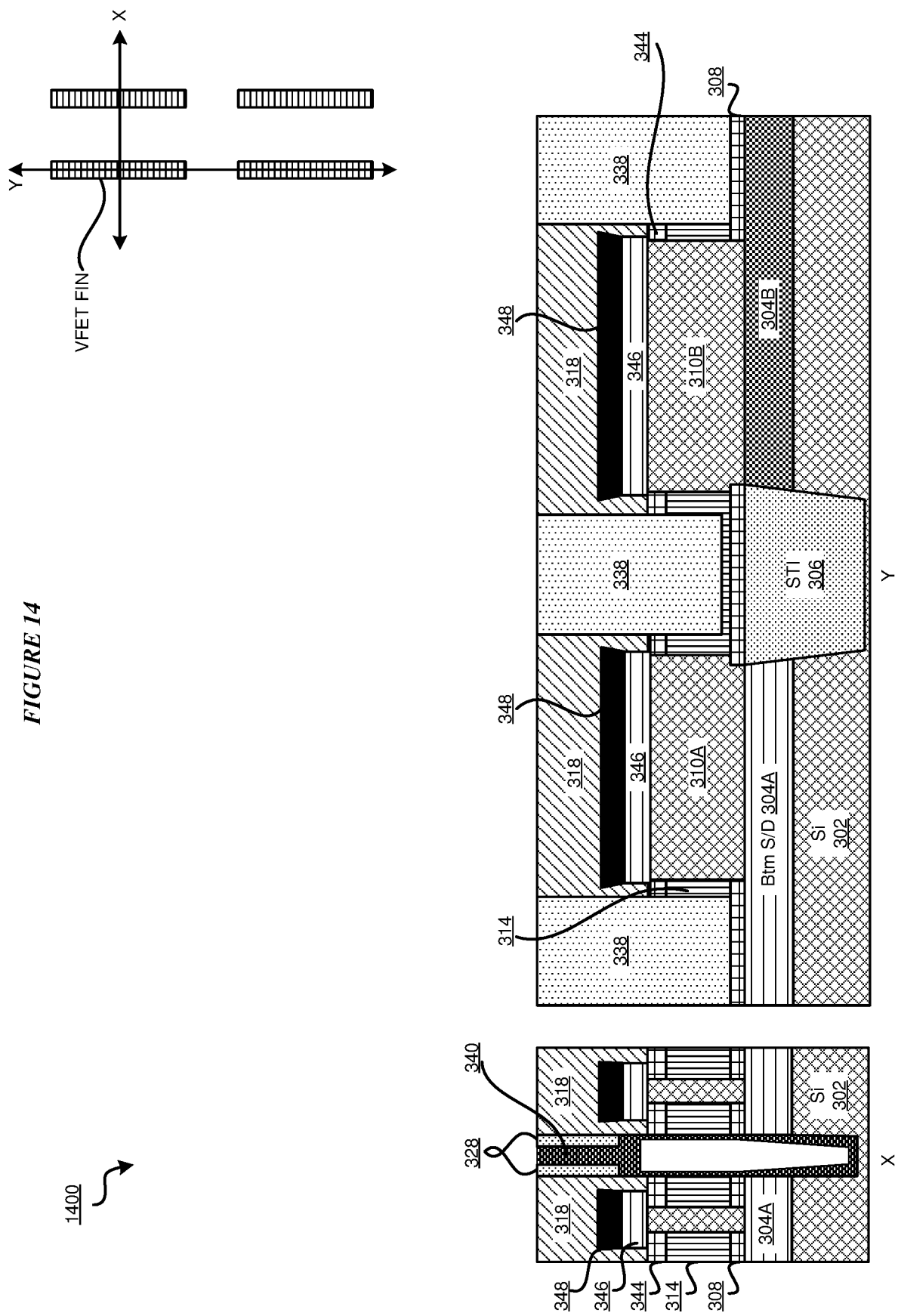
FIG. 14 depicts cross-section views of another portion of the process in which a structure is formed according to an illustrative embodiment.

With reference to FIG. 14, this figure depicts cross-section views of another portion of the process in which a structure 1400 is formed according to an illustrative embodiment. In the embodiment, fabrication system 107 removes a fin cap from first fin 310A and second fin 310B and forms a third dielectric spacer 344 on HKMG layer 314. In the embodiment, fabrication system 107 forms a top source/drain (S/D) 346 on third dielectric spacer 344. In the embodiment, fabrication system 107 optionally further forms a recess above top S/D 346 and deposits an optional silicide layer 348 formed on top of the top source/drain 346 within the recess.

Figure 15:
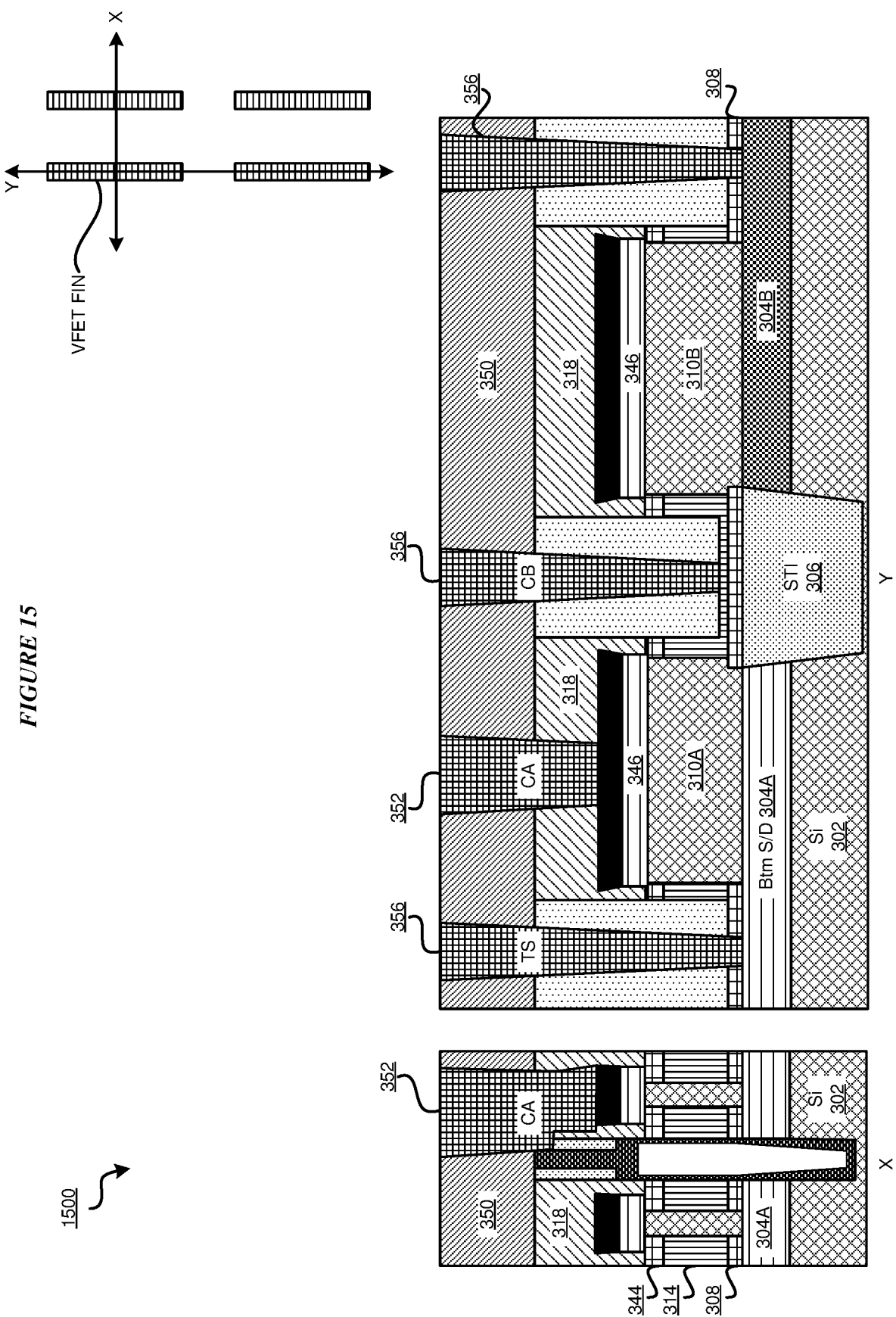
FIG. 15 depicts cross-section views of another portion of the process in which a structure is formed according to an illustrative embodiment.

With reference to FIG. 15, this figure depicts cross-section views of another portion of the process in which a structure 1500 is formed according to an illustrative embodiment. In the embodiment, fabrication system 107 deposits an interlayer dielectric (ILD) 350 upon the structure 1400 of FIG. 14, and forms contact trenches through ILD 350. In the embodiment, fabrication system 107 forms top S/D contact (CA) 352 in contact with top S/D 346, gate contact (CB) 354 in contact with metal gate of the HKMG layer 314, and two bottom S/D contacts (TS) 356 in contact with first bottom S/D 304A and second bottom S/D 304B, respectively. In at least one embodiment, top S/D contact (CA) 352 partially overlaps the air gap spacer 342 and is separated from air gap 342 by a solid dielectric fill 340 surrounded by oxide spacers 328. As a result, a VFET with reduced parasitic capacitance is fabricated in accordance with an embodiment. One or more embodiments may Include one or more of the following advantages: an air gap spacer that exists only between adjacent parallel fins, no S/D contact and gate contact subways, and additional capacitance reduction between bottom source/drains because the airgap in the isolation trench 322 extends all the way through the bottom S/D and into a portion of the substrate.

Figure 16A:
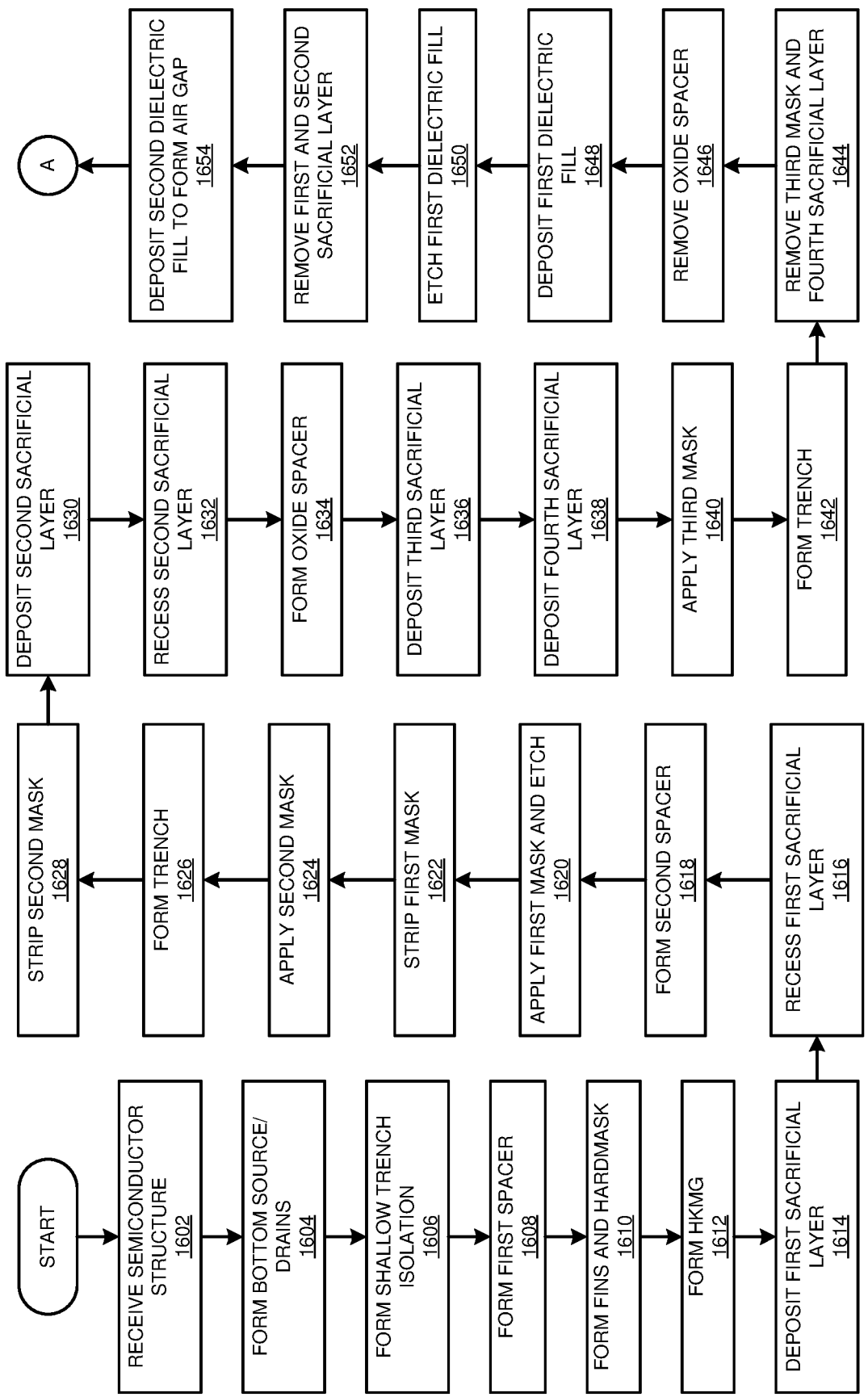
FIGS. 16A-16B depicts a flowchart of an example process for fabricating a vertical transistor with reduced parasitic capacitance according to an illustrative embodiment.
Figure 16B:
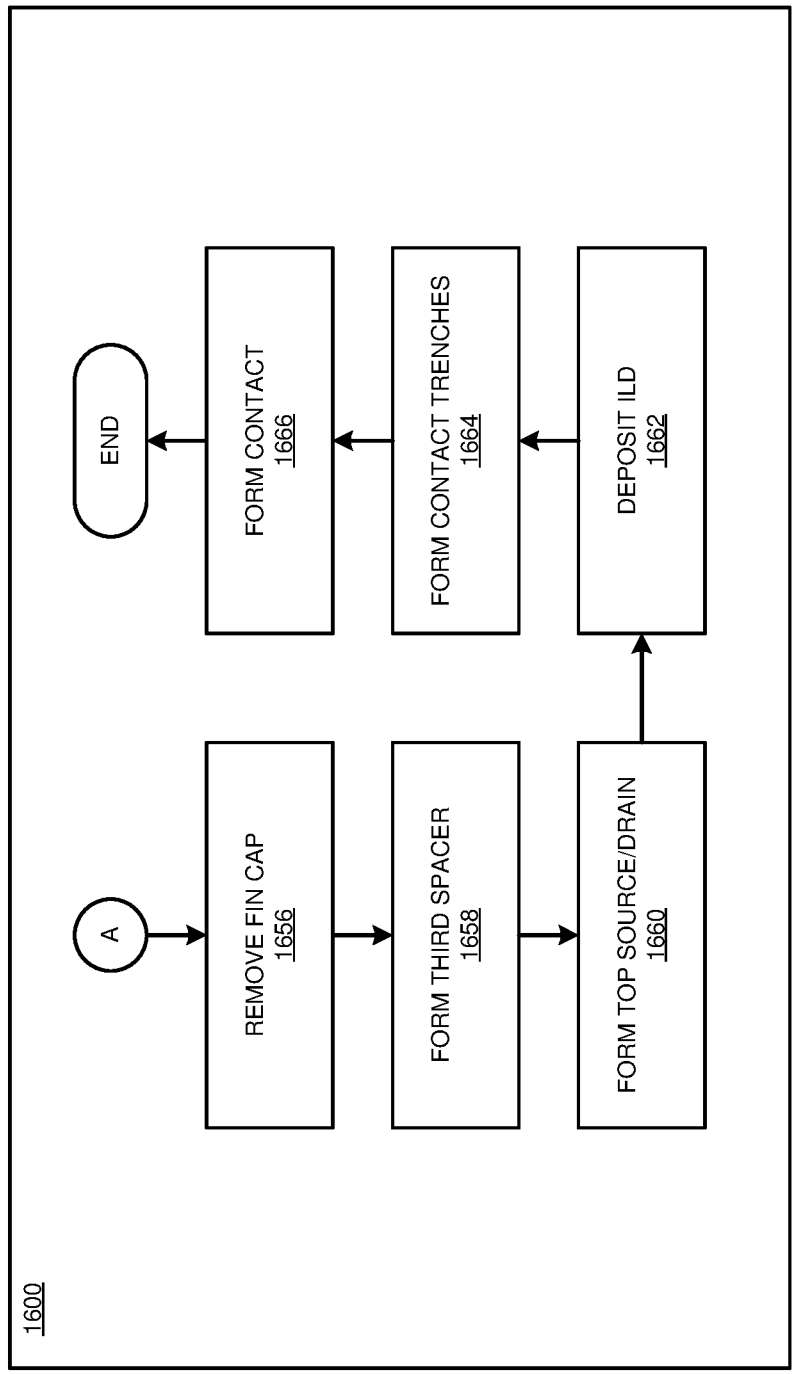

With reference to FIGS. 16A-16B, these figures depict a flowchart of an example process 1600 for fabricating a vertical transistor with reduced parasitic capacitance according to an illustrative embodiment. In block 1602, fabrication system 107 receives a semiconductor structure 300 including substrate 302. In block 1604, fabrication system 107 forms first bottom source/drain (S/D) 304A and second bottom S/D 304B formed on a top surface of substrate 302. In block 1606, fabrication system 107 forms STI layer 306 within the trench of substrate 302. In block 1608, fabrication system 107 forms first dielectric spacer 308 upon portions of upper surfaces of first bottom S/D 304A, second bottom S/D 304B, and STI layer 306. In block 1610, fabrication system 107 forms first fin 310A and second fin 310B on a portion of the upper surface of first bottom S/D 304A, second bottom S/D 304B, respectively, and forms first hardmask 312A and second hardmask 312B disposed upon an upper surface of first fin 310A and second fin 310B.

In block 1612, fabrication system 107 forms HKMG layer 314 upon first dielectric spacer 308 and vertical sides of portions of first fin 310A, first hardmask 312A, second fin 310B, and second hardmask 312B. In block 1614, fabrication system 107 deposits first sacrificial layer 316 in contact with HKMG layer 314. In block 1616, fabrication system 107 recesses first sacrificial layer 316 to an upper level of HKMG layer 314 such that first sacrificial layer 316 fills a void formed by HKMG layer 314.

In block 1618, fabrication system 107 forms second dielectric spacer 318 on portions of first hardmask 312A, second hardmask 312B, and HKMG layer 314. In block 1620, fabrication system 107 applies first (PB) mask 320 to portions of first sacrificial layer 316 disposed between first fin 310A and second fin 310B, performs patterning, and etches away the portions of first sacrificial layer 316 not protected by first mask 320 and horizontal portions of HKMG layer 314. In block 1622, fabrication system 107 strips first mask 320.

In block 1624, fabrication system 107 applies second mask 324 to protect the remaining portions of HKMG layer 314. In block 1626, fabrication system 107 forms isolation trench 322 into substrate 302 between first fin 310A and second fin 310B. In block 1628, fabrication system 107 strips second mask 324.

In block 1630, fabrication system 107 deposits second sacrificial layer 326 upon portions of HKMG layer 314. In block 1632, fabrication system 107 recesses second sacrificial layer 326 to below the top level of HKMG layer 314. In block 1634, fabrication system 107 forms oxide spacer 328 upon a portion of second sacrificial layer 326 and side surfaces of second dielectric spacer 318 within isolation trench 322. In block 1636, fabrication system 107 deposits third sacrificial layer 330 upon second dielectric spacer 318. In block 1638, fabrication system 107 deposits a fourth sacrificial layer 332 upon an upper surface of third sacrificial layer 330.

In block 1640, fabrication system 107 applies third mask 334 to fourth sacrificial layer 332. In block 1642, fabrication system 107 etches portions of third sacrificial layer 330 and second sacrificial layer 326 above STI layer 306 to form a trench 336 to expose HKMG layer 314. In block 1644, fabrication system 107 removes third mask 334 and fourth sacrificial layer 332. In block 1646, fabrication system 107 removes oxide spacer 328.

In block 1648, fabrication system 107 deposits first dielectric fill 338 upon the top surface of first dielectric spacer 308, HKMG layer 314, and trench 336. In block 1650, fabrication system 107 etches back first dielectric fill 338 to below a top level of third sacrificial layer 330. In block 1652, fabrication system 107 removes first sacrificial layer 316 and second sacrificial layer 326.

In block 1654, fabrication system 107 deposits second dielectric fill 340 in a portion of isolation trench 322 and pinching-off of the second dielectric fill 340 at the top of isolation trench 322 to form an air gap spacer 342 within isolation trench 322 between adjacent parallel fins 310A and 310B but not in fin-to-fin regions of the vertical transistor structure. In a particular embodiment, fabrication system 107 further performs a CMP process to planarize the top surface of the semiconductor structure. In block 1656, fabrication system 107 removes a fin cap from first fin 310A and second fin 310B. In block 1658, fabrication system 107 forms third dielectric spacer 344 on HKMG layer 314.

In block 1660, fabrication system 107 forms top source/drain (S/D) 346 on third dielectric spacer 344. In block 1662, fabrication system 107 deposits ILD 350 upon the semiconductor structure.

In block 1664, fabrication system 107 forms contact trenches through ILD 350. In block 1666, fabrication system 107 forms top S/D contact (CA) 352 in contact with top S/D 346, gate contact (CB) 354 in contact with HKMG layer 314, and two bottom S/D contacts (TS) 356 in contact with first bottom S/D 304A and second bottom S/D 304B, respectively. As a result, a VFET with reduced parasitic capacitance is fabricated in accordance with an embodiment. Fabrication system 107 ends process 1600 thereafter.

Thus, a computer implemented method is provided in the illustrative embodiments for fabricating a vertical transistor with reduced parasitic capacitance in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. An apparatus comprising:
   a substrate;
   a first fin and a second fin vertically disposed on the substrate, the first fin being adjacent to and parallel to the second fin;
   a first source/drain disposed on the substrate;
   a first dielectric spacer disposed on the first source/drain;
   a gate disposed on the first dielectric spacer and a portion of a vertical side of each of the first fin and the second fin;
   a trench adjacent to and parallel to the first fin and the second fin, the trench extending through a portion of the substrate, the trench including a top portion being narrower than a bottom portion;
   a dielectric material disposed within the trench and pinching off the top portion of the trench to form an air gap spacer within the trench, the air gap spacer being parallel to and between the first fin and the second fin along a longitudinal axis; and
   a first contact in contact with a second source/drain, the first contact partially overlying a portion of the air gap spacer along the longitudinal axis.

2. The apparatus of claim 1, further comprising:
   a second dielectric spacer on the gate, the gate being disposed between the first dielectric spacer and the second dielectric spacer.

3. The apparatus of claim 2, wherein the second source/drain is disposed on the second dielectric spacer.

4. The apparatus of claim 1, further comprising an interlayer dielectric deposited on the first fin, the second fin, and the substrate.

5. The apparatus of claim 4, wherein the first contact is formed through the interlayer dielectric.

6. The apparatus of claim 4, further comprising a second contact formed through the interlayer dielectric in contact with the gate.

7. The apparatus of claim 4, further comprising a third contact formed through the interlayer dielectric in contact with the first source/drain.

8. The apparatus of claim 1, wherein the air gap is confined between and parallel to the first fin and second fin.

9. The apparatus of claim 1, wherein the air gap is not disposed at an end of the first fin and the second fin.

* * * * *